United States Patent [19]

Suzuki et al.

[11] Patent Number: 4,672,255

[45] Date of Patent: Jun. 9, 1987

[54] SURFACE ACOUSTIC WAVE DEVICE

[75] Inventors: Hitoshi Suzuki; Yasuo Ebata, both of Yokohama; Sadao Matsumura; Jisaburo Ushizawa, both of Tokyo, all of Japan

[73] Assignee: Kabushiki Kaisha Toshiba, Kawasaki, Japan

[21] Appl. No.: 896,327

[22] Filed: Aug. 14, 1986

Related U.S. Application Data

[63] Continuation of Ser. No. 721,714, Apr. 10, 1985, abandoned.

[30] Foreign Application Priority Data

Jun. 5, 1984 [JP] Japan ................................ 59-114902
Jun. 5, 1984 [JP] Japan ................................ 59-114903

[51] Int. Cl.$^4$ ............................................ H01L 41/08
[52] U.S. Cl. ............................................... 310/313 A
[58] Field of Search ............................ 310/313 A; 333/150-155, 193-196

[56] References Cited

U.S. PATENT DOCUMENTS 4,489,250 12/1984 Ebata et al. ................. 310/313 A
4,523,119 6/1985 Whatmore et al. ........... 310/313 A

FOREIGN PATENT DOCUMENTS 5772414 of 0000 Japan .
594310 of 0000 Japan .

Primary Examiner—Mark O. Budd
Attorney, Agent, or Firm—Oblon, Fisher, Spivak, McClelland & Maier

[57] ABSTRACT

A surface acoustic wave device has been developed, such as a surface acoustic wave filter in which a plurality of electroacoustic interdigital electrodes are formed, as thin films made principally of aluminum, on the surface of a $Li_2B_4O_7$ single crystal substrate and a surface acoustic wave resonator, in which a plurality of electroacoustic interdigital electrodes and grating reflectors for reflecting the surface acoustic wave are formed, as thin films made principally of aluminum, on the surface of a $Li_2B_4O_7$ single crystal substrate. Here, a cut angle, at which the substrate is cut from the $Li_2B_4O_7$ single crystal, and the propagation direction of the surface acoustic wave are so set that, when the Eulerian angle representation is $(90°\pm\lambda, 90°\pm\mu, 90°\pm\theta)$, $\lambda = 38°$ to $52°$, $\mu = 0°$ to $5°$ and $\theta = 0°$ to $10°$, whereby the TCD of the surface acoustic wave device is below $\pm 5$ ppm/°C. and coupling coefficient $K^2$ is about 1.0%, and the propagation speed suffers almost no angular dependence.

8 Claims, 19 Drawing Figures

SURFACE ACOUSTIC WAVE DEVICE

This application is a continuation of application Ser. No. 721,714, filed Apr. 10, 1985, now abandoned.

BACKGROUND OF THE INVENTION

This invention relates to a surface acoustic wave device using a lithium tetraborate ($Li_2B_4O_7$) single crystal which is a piezoelectric material.

A surface acoustic wave device is known which is adapted to propagate a surface acoustic wave on a piezoelectric substrate on which an aluminum electrode is formed. The temperature coefficient of the delay time (hereinafter referred to merely as a TCD) and electromechanical coupling coefficient $K^2$ (hereinafter referred to merely as a coupling coefficient $K^2$) are important to a piezoelectric substrate. Here, the delay time means the time required for the surface acoustic wave to be propagated between two points, and the ratio in which it varies in accordance with the temperature is called a "TCD". TCD is preferred to have a smaller absolute value below 10 ppm/°C. for use on a resonant element. The coupling coefficient $K^2$ is the conversion efficiency of electric energy to surface acoustic wave energy, and the greater the coupling coefficient the better.

FIG. 1 shows the characteristics of a typical conventional substrate material (single crystal) for a surface acoustic wave. FIG. 1 shows a plot of the various materials with TCD (ppm/°C.) as the abscissa and the coupling coefficient $K^2$ (%) as the coordinate. An X-cut 112° Y-propagating X-112°Y lithium tantalate ($LiTaO_3$) has a coupling coefficient $K^2$ of a moderate value of about 0.8%, but its TCD is greater value of about 20 ppm/°C. On the other hand, an ST-cut (42°Y-X) quartz has a TCD of 0, but its coupling coefficient $K^2$ is a very small value of 0.1%. A 128°-rotation Y-cut X-propagating (128°Y-X) lithium niobate $LiNbO_3$ has a coupling coefficient $K^2$ of 4.8%, a value greater than that of $LiTaO_3$, but its TCD is a greater value of about 80 ppm/°C. which is unpractical. From this it will be appreciated that it is desirable to have a coupling coefficient $K^2$ of 0.8 to 1.0% as in the case of $LiTaO_3$ and a TCD of about 1/5 as in the case of $LiTaO_3$, preferably 0. Recently, attention has been paid to $Li_2B_4O_7$ as a desirable substrate for the surface acoustic wave. FIG. 1 shows the characteristics of a $Li_2B_4O_7$ single crystal (20°X-Z) which has been obtained from tests conducted by the inventors. $Li_2B_4O_7$ has a coupling coefficient $K^2$ of about 1%, an improvement over that of $LiTaO_3$, and a TCD of 0. "20°X-Z" indicates that the cut surface of the substrate is perpendicular to a rotated X-axis obtained by rotating the X-axis through 20° about the Z-axis toward the Y-axis, and that the propagation or transfer direction of the surface acoustic wave is parallel to the Z-axis. "20°X-Z" may be transformed to Eulerian angles (110°, 90°, 90°). Here, TCD is found through the calculation of the measured value of the oscillation frequency of an oscillator circuit using a surface acoustic wave delay line in which input and output electrodes comprised of normal interdigital electrodes are formed on the surface of the $Li_2B_4O_7$ single crystal substrate.

The surface acoustic wave device is also widely accepted for a surface acoustic wave resonator and surface acoustic filter. The surface acoustic wave resonator is implemented by forming terminal electrodes, comprised of interdigital electrodes, on the middle portion and grating reflectors one at each side portion of a piezoelectric substrate, noting that all of them are formed of evaporated films made principally of aluminum. The surface acoustic wave filter is realized by forming input and output electrodes, made up of interdigital electrodes, on a piezoelectric substrate, noting that these electrodes are formed of evaporated films made principally of aluminum. Since the energy of the surface acoustic wave is concentrated toward the surface of the substrate, the propagation characteristic of the surface acoustic wave is largely influenced by the surface conditions of the substrate. It has been found by the tests undertaken by the inventors that the temperature characteristic (TCD) deteriorates due to the formation of the Al-evaporated films. That is, the $Li_2B_4O_7$ single crystal (20°X-Z) substrate, though having a better TCD of its own, does not have as good a frequency/temperature characteristic, after the evaporated films, such as interdigital electrodes, principally made of aluminium have been formed.

In order to consider the deterioration of the characteristics due to the forming of the Al-evaporated films, the inventors constructed an oscillator circuit using a delay line with a dummy electrode of an Al-evaporated film uniformly formed, on a propagation path for a surface acoustic wave, between input and output electrodes. An optimum cut angle, at which the substrate is cut from an $Li_2B_4O_7$ single crystal to obtain a better TCD, and the direction of propagation of the surface acoustic wave, were found through the measurement of the oscillation frequency. This technique was filed under U.S. patent application Ser. No. 508,044 on June 27, 1983 entitled "Surface Acoustic Wave Device", and under European patent application No. 83303734.4 on June 28, 1983, entitled "Surface Acoustic Wave Device". The surface acoustic device here tested is for one type of the surface acoustic wave delay line and the temperature dependency of the delay time between input and output transducers is improved, but not the temperature dependency of the resonance frequency for the surface acoustic wave resonator or of the center frequency for the surface acoustic wave filter. Further experiments prove that a better temperature characteristic is not obtained for the surface acoustic wave device in which the interdigital terminal electrodes and/or grating reflectors are formed on a piezoelectric substrate having a determined cut angle and propagation direction.

Furthermore, since the $Li_2B_4O_7$ single crystal has an anisotropy as in the case of the other single crystal material, a slight change in the cut angle at which the substrate is cut from the crystal causes a greater variation, for example, in TCD and in the propagation speed of the surface acoustic wave, within a certain range. A resonant frequency $f_r$ (a central frequency $f_o$) is expressed by v/2l. Here, v is a propagation velocity of the surface acoustic wave and l is a pitch of an interdigital electrode and a grating reflector. It is therefore difficult to manufacture surface acoustic devices of the same characteristics with better reproducibility, without involving a change in the temperature characteristic, resonant frequency, center frequency, and so on.

SUMMARY OF THE INVENTION

It is accordingly an object of this invention to provide a surface acoustic wave device with a better temperature characteristic, in which interdigital electrodes and grating reflectors formed of Al-evaporated thin films are formed on a $Li_2B_4O_7$ single crystal substrate.

In one aspect of this invention a surface acoustic wave device is provided in which thin films made principally of aluminium are formed on the surface of a $Li_2B_4O_7$ single crystal substrate to permit the excitation, reception, reflection or propagation of a surface acoustic wave, in which a cut angle, at which the substrate is cut from the $Li_2B_4O_7$ single crystal, and the direction of propagation of the surface acoustic wave are so set, when an Eulerian angle notation is ($90°\pm\lambda$, $90°\pm\mu$, $90°\pm\theta$), as to be in a range of $\lambda = 38$ to $52°$, $\mu = 0$ to $5°$ and $\theta = 0$ to $10°$.

In another aspect of this invention a surface acoustic wave device is provided in which a cut angle, at which a substrate is cut from a $Li_2B_4O_7$ single crystal, and the direction of propagation of the surface acoustic wave are so set, when an Eulerian angle notation is ($90°\pm\lambda$, $90°\pm\mu$, $90°\pm\theta$), as to be within a range of $\lambda = 0$ to $2°$, $\mu = 13$ to $17°$ and $\theta = 0$ to $3°$.

DETAILED DESCRIPTION OF THE PREFERRED EMBODIMENTS

A source acoustic device according to one embodiment of this invention will be explained below by referring to the accompanying drawings.

Figure 1:
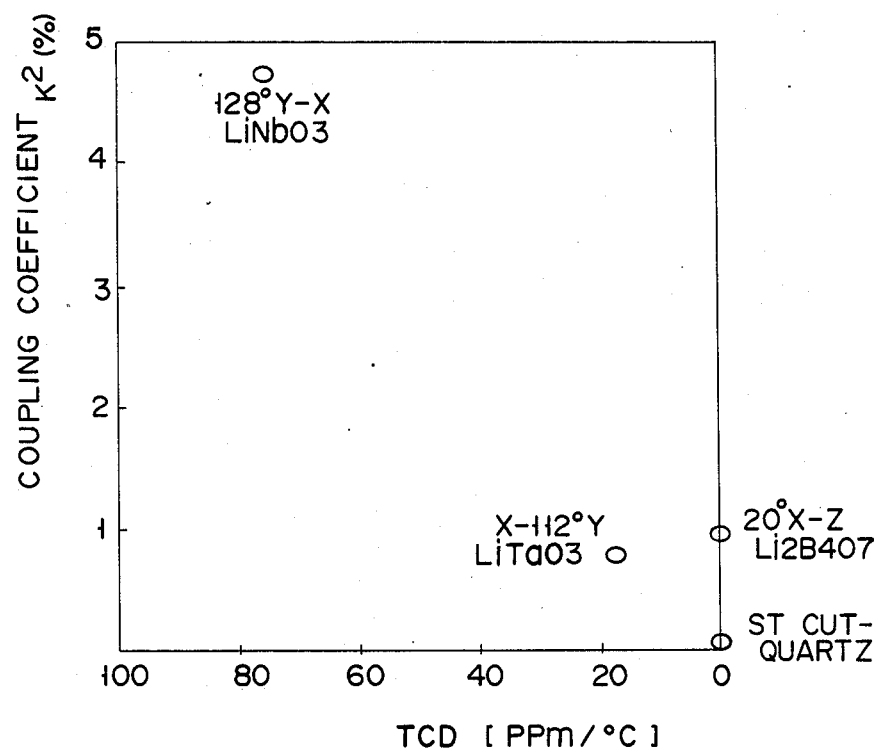
FIG. 1 is a graph showing the characteristics of a typical conventional substrate material for a surface acoustic wave device.
Figure 2:
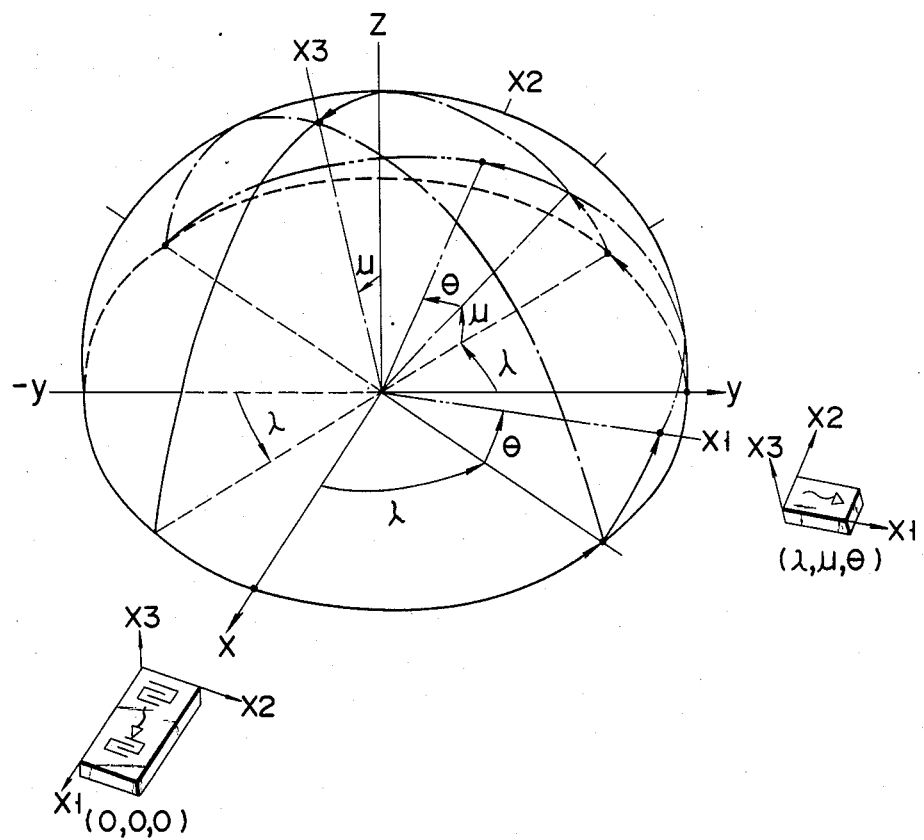
FIG. 2 is a view for explaining, in Eulerian angle notation, a cut angle, at which a surface acoustic wave substrate is cut from a single crystal, and the direction of propagation of a surface acoustic wave.

In a surface acoustic wave device according to this invention which uses a $Li_2B_4O_7$ substrate, a cut angle, at which the substrate is cut from a $Li_2B_4O_7$ single crystal, and the direction of propagation of a surface acoustic wave are found, noting that the single crystal has a better TCD and a better coupling coefficient $K^2$. Explanation will be given of an Eulerian angle as used in connection with the cut angle and the direction of propagation. Reference is invited to FIG. 2. In FIG. 2, $X1 = X$, $X2 = Y$ and $X3 = Z$ in a reference orientation (0, 0, 0) with $X1$ as the direction of propagation of a surface acoustic wave, $X3$ as the direction perpendicular to the crystal substrate and $X2$ perpendicular to these directions. The propagation direction $X1$ is rotated through an angle of $\lambda$ from the X-axis toward the Y-axis with the $X3$ axis as a center. Then, with the rotated $X1$ as a center, the direction $X3$ is counterclockwise rotated through the angle of $\mu$ from the axis Z, and then with the rotated $X3$ as a center the propagation direction $X1$ is further counterclockwise rotated through an angle of $\theta$. This permits the propagation direction, including a crystallographical orientation of the substrate plane, to be represented in an Eulerian angle representation ($\lambda$, $\mu$, θ). This invention is directed to finding the Eulerian angle (λ, μ, θ) corresponding to the better TCD and the coupling coefficient $K^2$.

Figure 3:
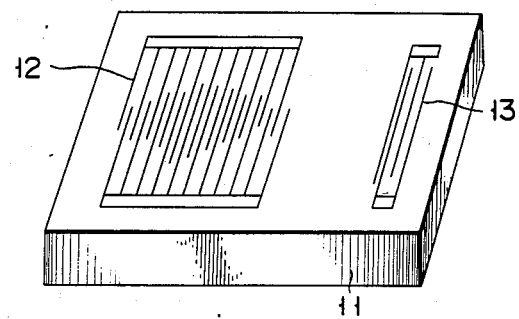
FIG. 3 is a perspective view showing a surface acoustic wave resonator which is used in measuring a TCD in a first embodiment of this invention as set out below.
Figure 4:
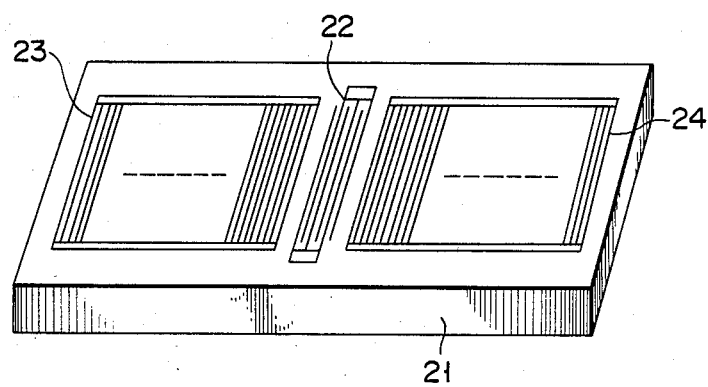
FIG. 4 is a perspective view showing a surface acoustic wave filter which is used for the measurement of an electromechanical coupling coefficient in the first embodiment of this invention.

Since the $Li_2B_4O_7$ single crystal belongs to a tetragonal system point group 4 mm, the measuring direction may be within a first quadrant and more specifically within an angle range of 0° to 45°. As a test specimen for the measurement of TCD use was made of a surface acoustic wave resonator using a $Li_2B_4O_7$ single crystal from which a piezoelectric substrate 21 was cut in those directions corresponding to an Eulerian angle representation (90°+λ, 90°+μ, 90°) direction and mirror-polished. The substrate 21 has, as shown in FIG. 4, at its middle portion, terminal electrodes 22 comprised of interdigital electrodes and, at the side portions, grating reflectors 23, 24 made of metal thin films, such as aluminium thin films, or mixed metal films, such as thin films comprised of aluminium as a principal material and very small amounts of Cu and Si. Here, the aluminum electrodes are generally formed by an etching step using a phosphorus-based etching solution. In this connection it is to be noted that since such an etching solution attacks the $Li_2B_4O_7$ single crystal it also does damage to the substrate surface and that according to this invention the aluminium films are evaporated as electrodes on the substrate surface by a lift-off method. Likewise, the coupling coefficient $K^2$ is also measured by a surface acoustic filter using a $Li_2B_4O_7$ single crystal from which a substrate 11 was cut in those directions corresponding to an Eulerian angle representation (90°+λ, 90°+μ, 90°) and mirror-polished at the surface. The substrate 11, as shown in FIG. 3, has input and output electrodes 12 and 13 comprised of interdigital electrodes made of aluminium-evaporated films. It is to be noted that the Eulerian angle representation (90°, 90°, 90°) means an X-cut Z-propagating representation. Here, the resonator for measurement has the following arrangement. That is, use is made of the grating reflectors having 200 strips and interdigital transducer having 11 pairs of electrodes, noting that the strip and electrode pitch is 28 μm and that the interdigital transducer and grating reflectors are made of 0.1 to 1.5 μm-thick aluminium films. In the surface acoustic wave filter for measurement, use is made of 14 pairs of interdigital electrodes with the pitch of 41 μm and a film thickness of 0.2 μm.

Figure 5:
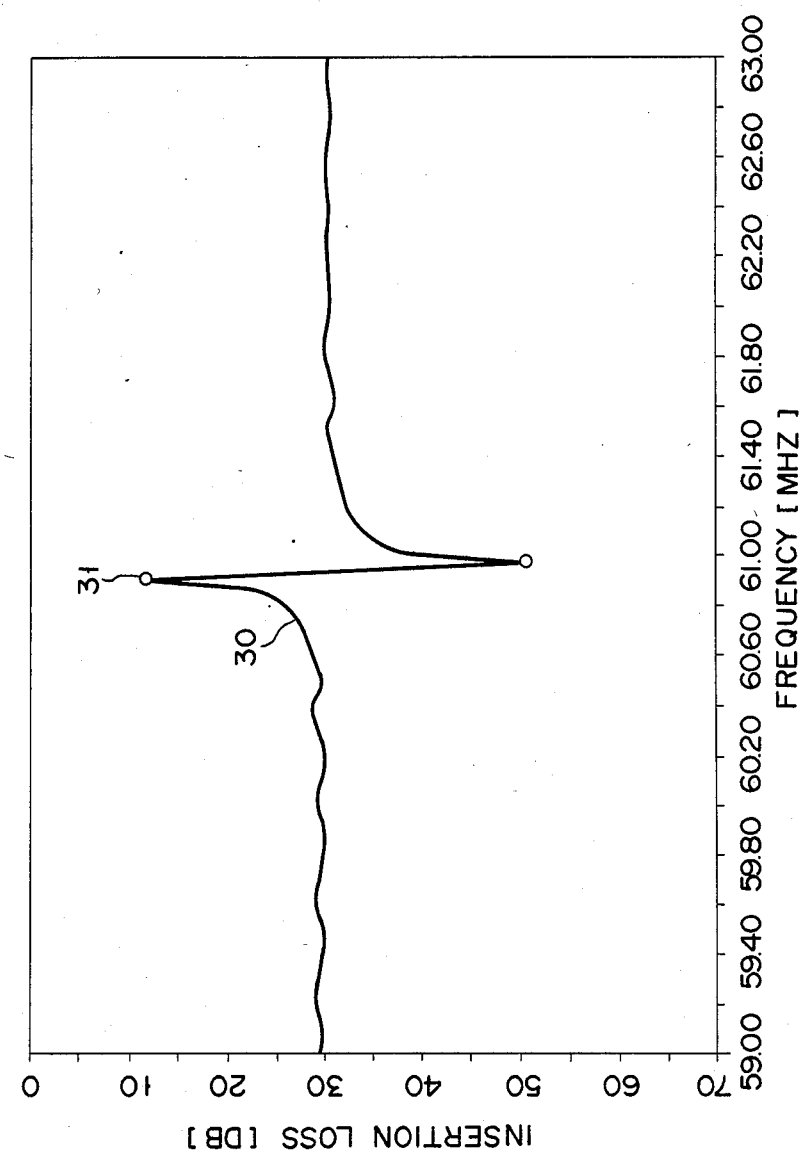
FIG. 5 is a graph showing an insertion loss versus frequency characteristic of the resonator according to the first embodiment of this invention.
Figure 6:
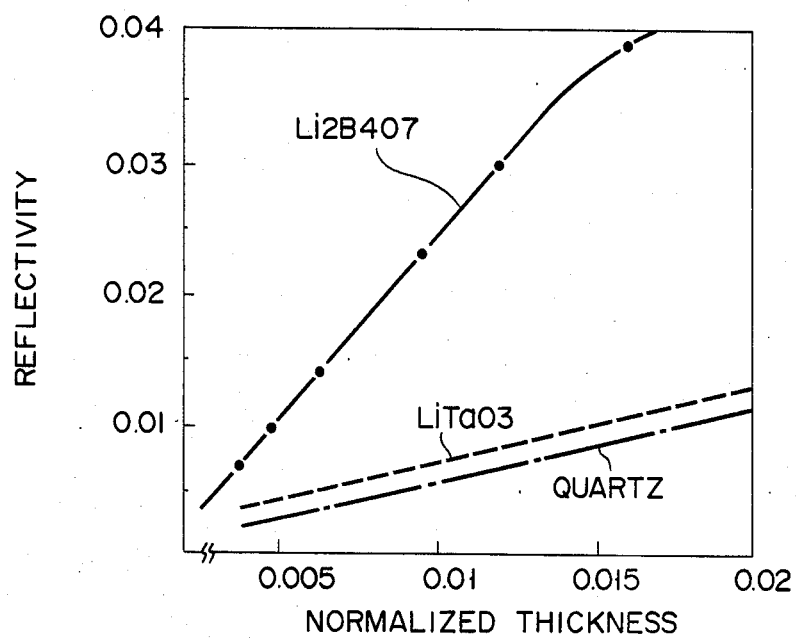
FIG. 6 is a graph showing a relation of a reflectivity to an aluminium thickness of the resonator according to the first embodiment of this invention.

FIG. 5 is a graph showing the frequency characteristic of an insertion loss when a resonator (λ=42°, μ=0° and θ=0°) for measurement is inserted into 50Ω system. In this graph, the ordinate represents the insertion loss and the abscissa represents the frequency with a circle 31 as a resonant point. The interdigital terminal electrodes and grating reflectors of this resonator are comprised of a 0.5 μm-thick aluminium film. It is known that a change in the thickness of the aluminum film results in a change in the reflecting characteristic of the grating reflector. FIG. 6 is a graph showing, in comparison with an already practicalized $LiTaO_3$ and quartz substrates, the reflection per bar of the grating reflectors on the $Li_2B_4O_7$ single crystal substrate when the film thickness varies. In the graph, the broken line corresponds to the $LiTaO_3$ substrate; the dash dot line corresponds to the quartz substrate and the solid line shows the $Li_2B_4O_7$ single crystal substrate. At the aluminium thickness of below about ¼, the $Li_2B_4O_7$ single crystal substrate is as good in its reflectivity as the $LiTaO_3$ and quartz substrates. Stated in more detail, a better reflectivity is obtained at the film thickness of 0.3 to 0.8 μm, but there is as yet no practical hindrance within a range of 0.1 to 1.5 μm, though dependent upon the conditions required for the resonant element. At the film thickness of about 0.8 μm, the reflection is increased, and a surface acoustic wave is converted into the substrate in an increasing amount, to a radiation bulk wave. In consequence, a greater mode change occurs within the grating reflectors, thus lowering the Q value of the resonant element. The characteristic of reflectivity in relation to the film thickness is tested at the resonant frequency of 60 MHz. The optimal film thickness varies, depending upon the resonant frequency. For generalization purposes, the film thickness is represented by a normalized film thickness obtained by dividing the actual film thickness by a resonant frequency. In this connection it is to be noted that in FIG. 6 the abscissa shows such a normalized film thickness. That is, the film thickness of 0.3 to 0.8 μm as set out above corresponds to a normalized thickness of 0.005 to 0.015.

The following are the measured values of the equivalent circuit constant and performance index of the surface acoustic wave resonator using the $Li_2B_4O_7$ single crystal substrate having the terminal electrodes and grating reflectors made of 0.5 μm-thick aluminium films. From this it wll be seen that a resonator of better oscillation performance is obtained.

resonant resistance R=124Ω
series inductance L=2.6 mH
series capacitance C=0.0026 pH
parallel capacitance Co=1.6 pH
unloaded Q=8000
capacitance ratio Co/C=600
figure of merit=13

A TCD was obtained from the measured value of the resonant frequency $f_r$ of an oscillation circuit using this surface acoustic wave resonator.

$$TCD = -\Delta f/(f_r \Delta T) \qquad (1)$$

where
  $f_r$: the resonant frequency (Hz) at 25° C.
  Δf: a variation in the resonant frequency (Hz)
  ΔT: a variation in the temperature (°C.) of the piezoelectric substrate On the other hand, the coupling coefficient $K^2$ was found from the measured value of the input impedance of the surface acoustic wave filter.

$$\text{Coupling coefficient } K^2 = \pi Co/4RaN \qquad (2)$$

where
  Co: the electrostatic capacitance of the interdigital electrode
  Ra: the radiation impedance at the center frequency
  N: the number of pairs of the interdigital electrodes, noting that Co and Ra were measured using network analyzer.

The propagation velocity v(m/s) is found from the resonant frequency $f_r$ (MHz) and the pitch l of the interdigital electrode and reflecting strip.

$$v = f_r 2l \qquad (3)$$

Figure 7A:
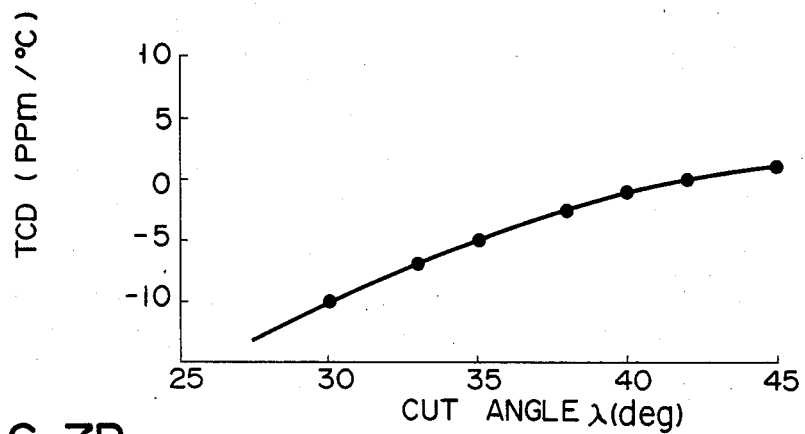
FIG. 7A is a graph showing a relation of $\lambda$ to TCD obtained from a temperature coefficient of a resonant frequency f of a surface acoustic wave resonator using a $Li_2B_4O_7$ single crystal substrate in an Eulerian angle representation ($90°+\lambda$, $90°$, $90°$)
Figure 7B:
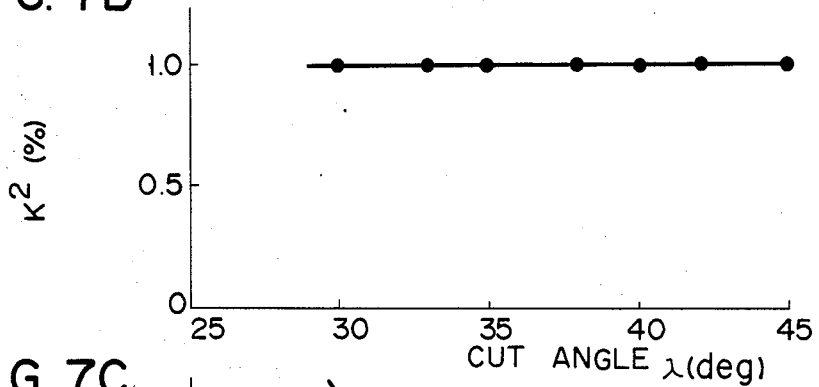
FIG. 7B is a graph showing a relation of $\lambda$ to an electrochemical coupling coefficient found from the input impedance of a surface acoustic wave filter using a $Li_2B_4O_7$ single crystal substrate in an Eulerian angle representation ($90°+\lambda$, $90°$, $90°$)
Figure 7C:
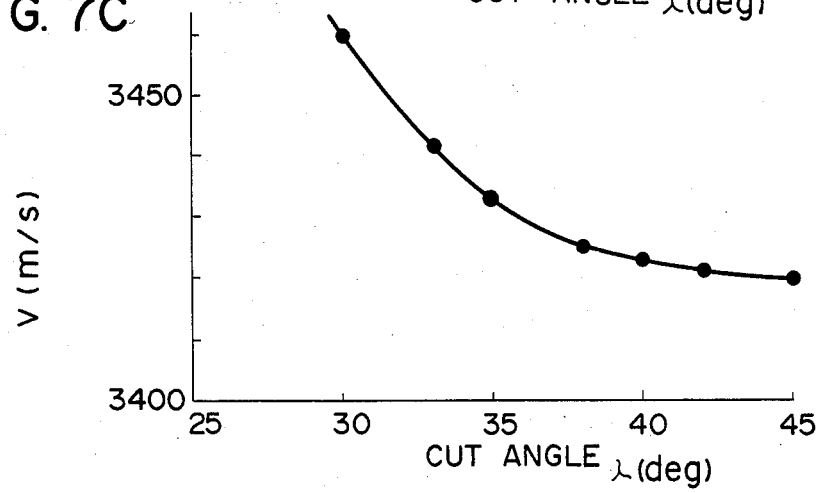
FIG. 7C is a graph showing a relation of $\lambda$ to a surface acoustic wave propagation speed found from the resonant frequency f and pitch of interdigital electrodes and grating reflectors of a surface acoustic wave resonator using a $Li_2B_4O_7$ single crystal substrate in an Eulerian angle representation ($90°+\lambda$, $90°$, $90°$)

FIGS. 7A through 7C show the TCD, coupling coefficient $K^2$ and v which are obtained when λ varies in connection with the surface acoustic wave device using the $Li_2B_4O_7$ single crystal substrate in an Eulerian angle representation (90°+λ, 90°, 90°). If λ=0°, an X-cut Z-propagating mode is represented. Therefore, the increase of $\lambda$ means that the cross-section as obtained from the cut angle defines a plane perpendicular to the axis which radiated from the X-axis toward the Y-axis through the angle of $\lambda$.

With attention paid to the TCD characteristic, it varies in a positive direction with an increase in the angle in $\lambda$. At $\lambda=30°$, TCD$=-10$ ppm/°C. and, at $\lambda=42°$, TDC$=0$. Thus, an optimal $\lambda$ value is within a range of $42\pm1°$ and within a practical range of 38° to 45° if allowed on the order of $\pm5$ ppm/°C. Since the Li$_2$B$_4$O$_7$ single crystal belongs to the tetragonal system point group 4 mm, symmetry is obtained at $\lambda=45°$. In consequence, the angle $\lambda$ of 38° to 52° provides TCD of below $\pm5$ ppm/°C. The angle $\lambda=45\pm1°$ may be preferable if attention is paid to the case with which measurement is made for the crystal to be cut in a given crystallographic orientation. That is, with $\lambda=45°$ a (110) crystallographic face is involved, making it easier to detect the crystallographic face from a lattice point.

The coupling coefficient $K^2$ in FIG. 7B is substantially constant irrespective of the angle $\lambda$.

In FIG. 7C, the propagation velocity v decreases with an increasing angle $\lambda$. The extent of a decrease of v against a variation of the angle $\lambda$, that is, the angular dependence, becomes smaller, the greater the angle $\lambda$. Within an angle range of $\lambda=38°$ to 45°, the angular dependence of v is so held as to be of the order of 5 m/s. The smaller angular dependence means a smaller change in the characteristics of the substrate even if the above-mentioned cut angle somewhat varies. This feature is very advantageous in the manufacture of the substrate.

From the above-mentioned results it has been found that the angle $\lambda$ should be set to be equal to 38° to 52° so as to realize the optimal characteristics.

Figure 8:
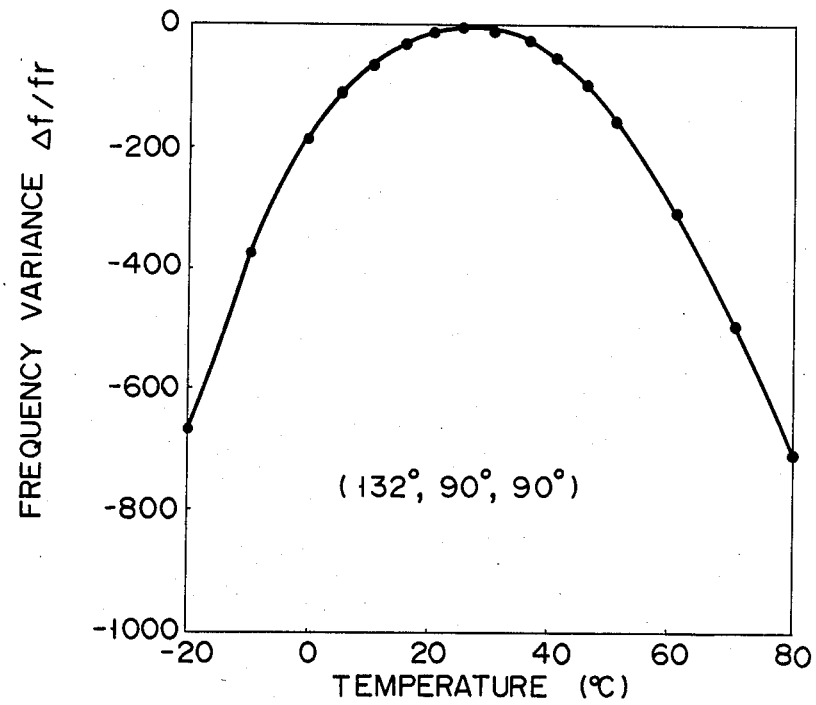
FIG. 8 is a graph showing a temperature dependence of a resonant frequency of a surface acoustic wave resonator using a $Li_2B_4O_7$ single crystal substrate in an Eulerian angle representation ($132°$, $90°$, $90°$)

FIG. 8 is a graph showing the temperature dependence of a resonant frequency of a resonator using Li$_2$B$_4$O$_7$ single crystal substrate in an Eulerian angle representation (132°, 90°, 90°) for the cut angle and propagation direction. In the graph of FIG. 8, the ordinate shows a variation of the resonant frequency $\Delta f/f_r$ and the abscissa shows the temperature. From this graph it has been found that the dependence of the resonant frequency upon the temperature varies in a hyperbolic fashion, that the second-order temperature coefficient is $-280\times10^{-9}$/°C.$^2$ and that TCD becomes zero in the neighborhood of ordinary temperature.

Figure 9A:
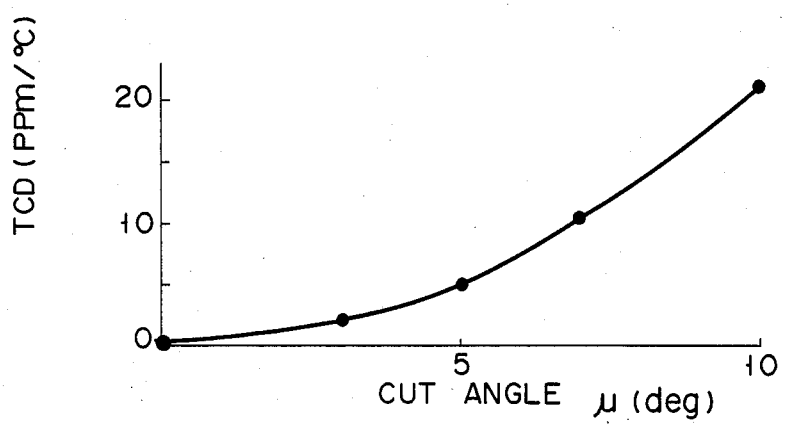
FIG. 9A is a graph showing a relation of $\mu$ to TCD found from a temperature coefficient of the resonant frequency of a surface acoustic wave resonator using a $Li_2B_4O_7$ in an Eulerian angle representation ($132°$, $90°+\mu$, $90°$)
Figure 9B:
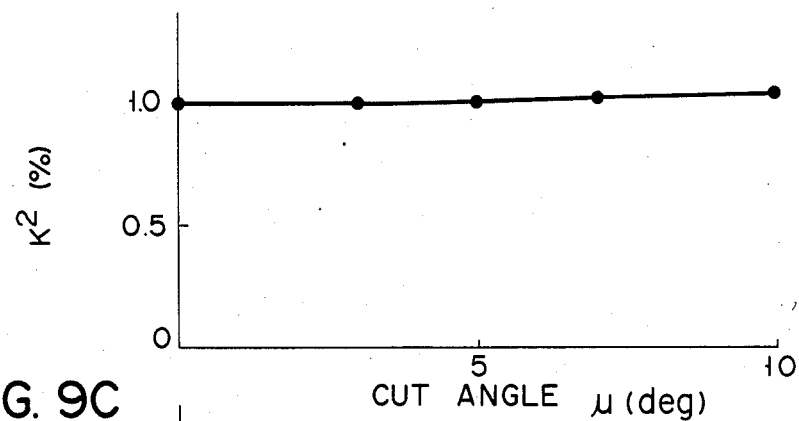
FIG. 9B is a graph showing a relation of $\mu$ to an electromechanical coupling coefficient found from the input impedance characteristic of a surface acoustic wave filter using a $Li_2B_4O_7$ single crystal substrate in an Eulerian angle representation ($132°$, $90°+\mu$, $90°$)
Figure 9C:
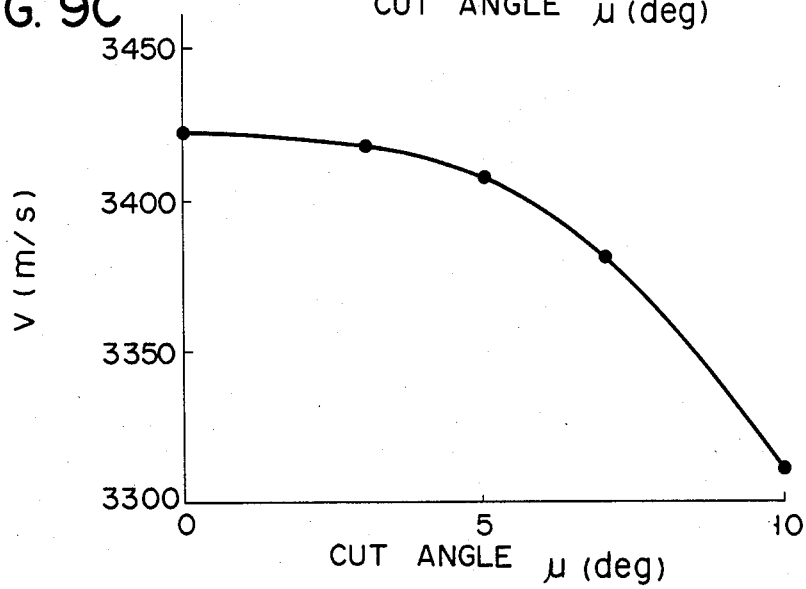
FIG. 9C is a graph showing a relation of $\mu$ to a surface acoustic wave propagation speed obtained from a resonant frequency and pitch of interdigital electrodes and grating reflectors of a surface acoustic wave resonator using a $Li_2B_4O_7$ single crystal substrate in an Eulerian angle representation ($132°$, $90°+\mu$, $90°$)

FIGS. 9A to 9C show a TCD, $K^2$ and v, respectively, found from Equations (1) to (3) when $\mu$ varies in connection with a surface acoustic device using a Li$_2$B$_4$O$_7$ single crystal substrate in an Eulerian angle representation (132°, 90°+$\mu$, 90°). Here, at $\mu=0°$, a 42° X-Z propagation orientation is involved and, an increase of $\mu$ means that the cut plane and propagation direction are counterclockwise rotated from the Z-axis.

In FIG. 9A, with attention paid to the TCD characteristic, an increase of $\mu$ causes the TCD to increase from zero in a positive direction. At $\mu=10°$, the TCD reaches 20 ppm/°C. Although the most preferable value of $\mu$ is zero, the value of $\mu$ is 0° to 5° if the TCD is allowed to be up to $\pm5$ ppm/°C.

In FIG. 9B, the coupling coefficient $K^2$ remains approximately constant, though somewhat increased with an increase of $\mu$.

In FIG. 9C, an increase in $\mu$ results in a decrease in v and the extent of the decrease in v against the variation in $\mu$ (i.e., the angular dependence) increases with an increase in $\mu$. In this connection it is to be noted that at $\mu\geq5°$ the extent of the decrease in v against the variation in $\mu$ rapidly increases. In consequence, $\mu$ is preferred to have a smaller value. From the above results it has been found that $\mu$ is required to be set to be 0° to 5° so as to realize the optimal characteristics of the device.

Figure 10A:
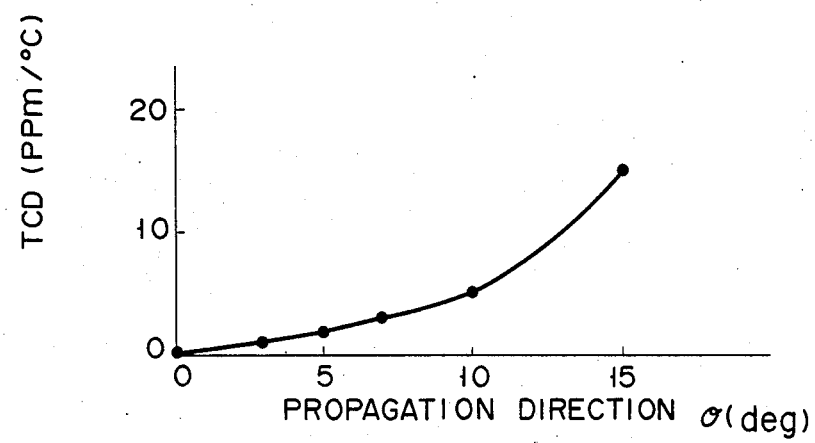
FIG. 10A is a graph showing a relation of $\theta$ to TCD obtained from a temperature coefficient of a resonant frequency f of a surface acoustic wave resonator using a $Li_2B_4O_7$ single crystal substrate in an Eulerian angle representation ($132°$, $90°$, $90°+\theta$)
Figure 10B:
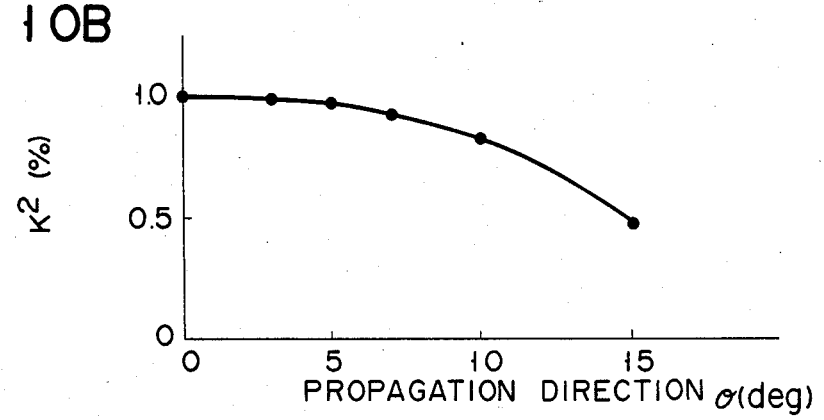
FIG. 10B is a graph showing a relation of $\theta$ to an electromechanical coupling coefficient found from the input impedance of a surface acoustic wave filter using a $Li_2B_4O_7$ single crystal substrate in an Eulerian angle representation ($132°$, $90°$, $90°+\theta$)
Figure 10C:
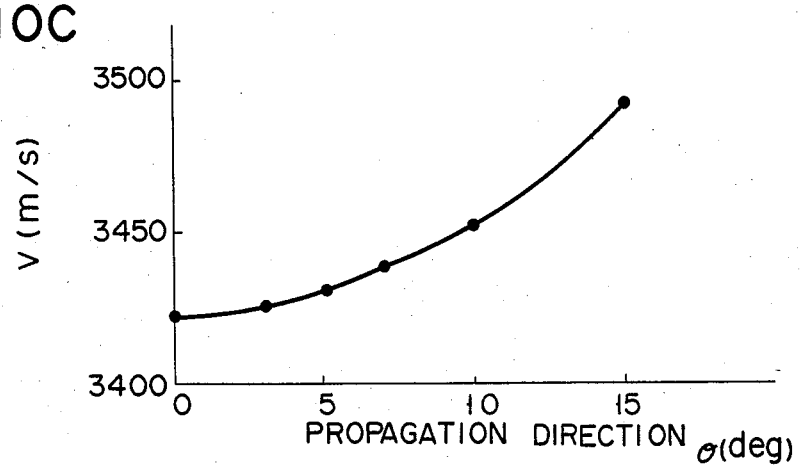
FIG. 10C is a graph showing a relation of $\theta$ to a surface acoustic wave propagation speed found from the resonant frequency f and pitch of interdigital electrodes and grating reflectors of a surface acoustic wave resonator using a $Li_2B_4O_7$ single crystal substrate in an Eulerian angle representation ($132°$, $90°$, $90°+\theta$)

FIGS. 10A to 10C show a TCD, $K^2$ and v, respectively, found from Equations (1) to (3) when $\theta$ (the direction of propagation) varies in connection with a surface acoustic wave device using a Li$_2$B$_4$O$_7$ single crystal substrate in an Eulerian angle representation (132°, 90°, 90°+$\theta$). Here, at $\theta=0°$, a 42°X-Z-propagation orientation is involved and, the increase in $\theta$ means that the direction of propagation is counterclockwise rotated in the 42°X plane from the Z-axis with the cut plane as the 42°X plane.

In FIG. 10A, with attention paid to the TCD characteristic, the increase in $\theta$ results in increasing the TCD in a positive direction from zero. At $\theta=15°$, the TCD reaches 15 ppm/°C. The angle $\theta$, though most preferable to be 0, becomes 0° to 10° if the TCD is allowed to be up to $\pm5$ ppm/°C.

In FIG. 10B, the increase in $\theta$ results in the decrease in $K^2$, and $K^2$ becomes 0.8% at $\theta=10°$ and 0.5% at $\theta=15°$.

In FIG. 10C, v increases with an increase in $\theta$, and the extent of the increase in v against a variation in $\theta$ (i.e. the angular dependence) becomes greater with an increase in $\theta$, provided that at $\theta\leq10°$ the extent of the increase in v against the variation in $\theta$ is so small that it produces no practical problem. From the above it has been found that $\theta$ is required to be 0° to 10° so as to implement an optimal characteristic.

Although the angles $\lambda$, $\mu$, $\theta$ have been explained as representative values, the same results are shown from the standpoint of the symmetry 4 mm of the Li$_2$B$_4$O$_7$ single crystal when the angle 90° is replaced by 0°, 180° and 270°. In this connection it is to be noted that, for the angles $\mu$ and $\theta$ whether positive or negative, the same results are shown.

According to this invention, a surface acoustic wave device using a Li$_2$B$_4$O$_7$ single crystal substrate is obtained in which the cut angle, from which the substrate is cut from the Li$_2$B$_4$O$_7$ single crystal, and the propagation direction are so set that, when the Eulerian angle representation is (90°$\pm\lambda$, 90°$\pm\mu$, 90°$\pm\theta$), $\lambda=38°$ to 52°, $\mu=0°$ to 5° and $\theta=0°$ to 10°, assuring better temperature and frequency characteristics and permitting substantially the same characteristics (even if the cut angle somewhat varies), to be obtained.

A surface acoustic wave device according to a second embodiment of this invention will be explained below.

According to the second embodiment of this invention, an optimal cut angle and propagation direction are found, paying attention to the other characteristics.

The above embodiment intends to lower the variation of the propagation velocity v with respect to $\lambda$. The second embodiment intends to lower the diffraction loss with respect to $\mu$. However, both embodiments realize that TCD is smaller than $\pm5$ ppm/°C. and $K^2$ is about 1%.

In general, a surface acoustic wave is propagated on the surface of the substrate, while being diffracted, and thus the wave front is broadened, providing a cause for propagation loss (i.e., a diffraction loss). This causes an increase in insertion loss and a deterioration in the frequency's characteristics in a surface acoustic wave filter and surface acoustic wave delay line and causes a lowering of a Q value in a surface acoustic wave resonator. According to the second embodiment, therefore, an optimal cut angle and propagation direction are found, assuring a substrate of lower diffraction loss.

As $Bi_{12}GeO_{20}$ crystal substrate of (45°, 40°, 90°) in an Eulerian angle representation, and $LiTaO_3$ crystal substrate of (0°, 64°, 90°) in Eulerian angle representation, are known as a surface acoustic wave substrate of lower diffraction loss. In general, with the speed in a main propagation direction as $v_o$, the propagation velocity in a direction shifted through an angle $\theta$ (Rad) from the major propagation direction is given below:

$$v(\theta) = v_o[1 + (\gamma/2)\theta^2] \quad (4)$$

In the above-mentioned substrate of lower diffraction loss, $\gamma = 1$. Generally, the wave front tends to be broadened due to diffraction. At $\gamma = 1$, however, a flow of energy on the wave front is along a direction parallel to the main propagation direction and thus the surface acoustic wave is propagated with the distribution of energy at a driving source being maintained, thus producing no diffraction loss. However, the above-mentioned substrate is found unsatisfactory in terms of TCD.

Figure 11:
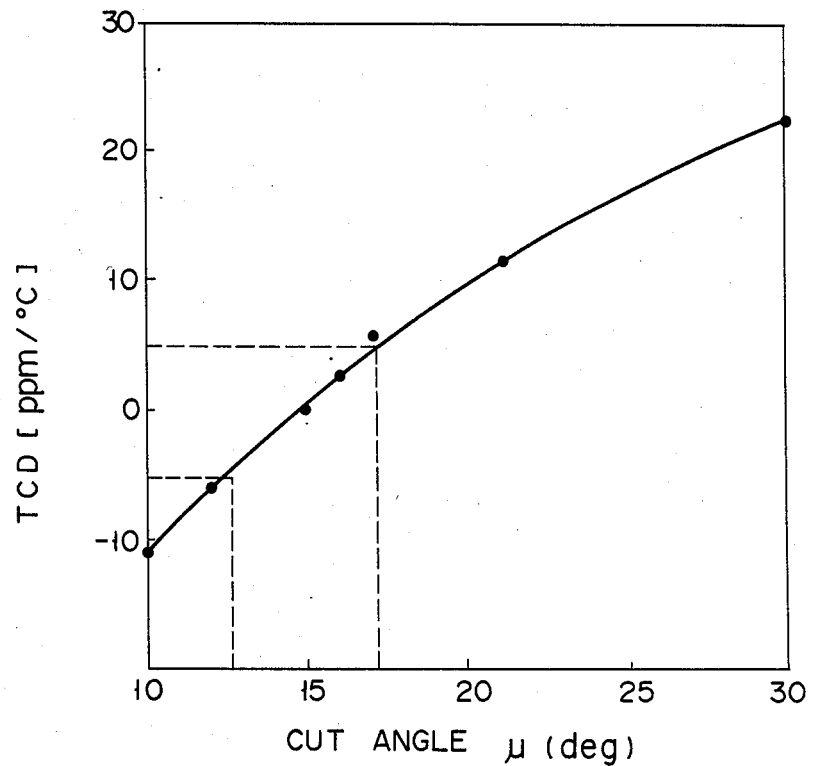
FIG. 11 is a graph showing a TCD versus $\mu$ relation of a surface acoustic wave resonator using a $Li_2B_4O_7$ single crystal substrate in an Eulerian angle representation ($90°$, $90°+\mu$, $90°$)

Measurement was also made by using the same test specimen as in the first embodiment. In FIG. 11, $\theta$ and $\lambda = 0°$. That is, FIG. 11 shows a TCD found from Equation (1) when an angle $\mu$ is varied in connection with a surface acoustic wave resonator using a $Li_2B_4O_7$ single crystal substrate of (90°, 90°+$\mu$, 90°) in an Eulerian angle representation. From this it has been found that TCD is within a range of ±5 ppm/°C. at $\mu = 13°$ to 17° and becomes zero at $\mu = 15°$. Although the value of $\mu$ to obtain TDC=0 slightly varies dependent upon the material and thickness of interdigital electrodes and grating reflectors, this can be remedied by slightly and correspondingly varying the angle of $\mu$ within the above-mentioned range. From the results of the test it has been found that the coupling coefficient $K^2$ is about 1% within an angle range of $\mu = 10°$ to 30° and that there is almost no angular dependence against the angle of $\mu$.

Figure 12:
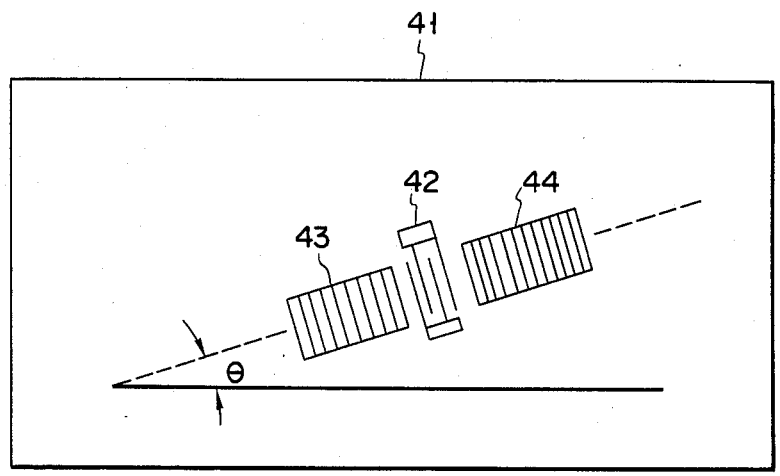
FIG. 12 is a plan view showing a test specimen as used in examinining the defraction loss characteristics of a second embodiment of this invention.

The diffraction loss characteristic was also examined. An interdigital electrode 42 and grating reflectors 43, 44 were formed on a $Li_2B_4O_7$ single crystal substrate 41 so as for a surface acoustic wave to be propagated on the surface of the substrate in a direction displaced by an angle $\theta$ relative to the main propagation direction as shown in FIG. 12, and the surface acoustic wave propagation velocity is found with respect to the angle of $\theta$. $\gamma$ is found from a ratio between the velocity $v_o$ in the main propagation direction and the velocity $v(\theta)$ in the direction displaced by the angle of $\theta$ from the main propagation direction to see how near $\gamma$ is to $-1$.

Figure 13:
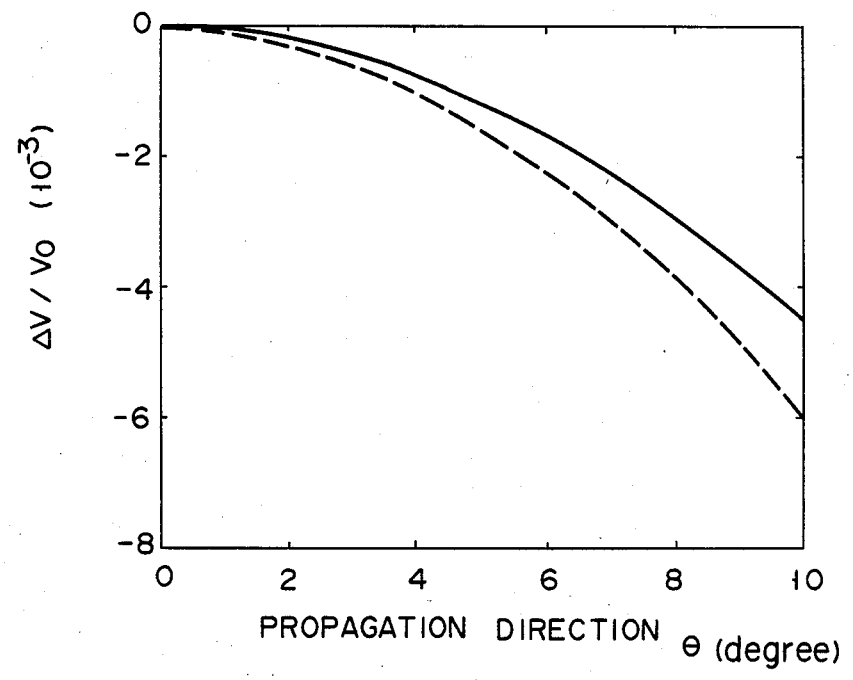
FIG. 13 is a graph showing a relation of the direction of propagation of a surface acoustic wave to the propagation velocity of a resonator using a $Li_2B_4O_7$ single crystal substrate in an Eulerian angle representation ($90°$, $105°$, $90°$).

FIG. 13 is a graph showing a variation ($\Delta v/v_o$: $\Delta v = v_o - v(\theta)$) of the propagation speed against $\theta$ in connection with a resonator using a $Li_2B_4O_7$ single crystal substrate for $\lambda = \theta = 0°$ and $\mu = 15°$ which are optimal values to TCD and $K^2$. In a graph of FIG. 13, the solid line shows the characteristic at $\gamma = -1$ in Equation (4). As a result, $\gamma$ was found to be $-0.8$. In the resonator using an X-cut Z-propagating $Li_2B_4O_7$ single crystal substrate, the ratio $\gamma$ is $-0.1$ and a substrate of (110°, 90°, 90°) in an Eulerian angle representation is +0.3. From these it has been found that $\gamma = 0.8$ is of a sufficiently good value. The cut angle, at which a substrate for a surface acoustic wave device is cut from a $Li_2B_4O_7$ single crystal, and the propagation direction are preferably set so that, when the Eulerian angle representation is (90°±$\lambda$, 90°±$\mu$, 90°±$\theta$), $\lambda = 0°$, $\mu = 13$ to 17° and $\theta = 0°$, taking the diffraction loss into consideration. As can be surmised from the result of the measurement in the first embodiment, the angle $\lambda$ has an allowable range of about 2°, such as a practical range of $\lambda = 0°$ to 2°, while the angle $\theta$ has an allowable range of about 3°, such as a practical range of $\theta = 0°$ to 3°. Since the diffraction loss is small, the Q value of the resonator increases and the insertion loss of the filter decreases.

According to this invention, therefore, a surface acoustic wave device is provided which has better temperature and frequency characteristics and a lower diffraction loss not appreciably affected even if the cut angle somewhat varies, and thus can manufacture articles of the same characteristics with a better reproducibility.

What is claimed is:

1. A surface acoustic wave device having a plurality of electrodes which are arranged at fixed intervals and made principally of aluminum on the surface of a $Li_2B_4O_7$ single crystal substrate to permit the excitation, reception, reflection or propagation of a surface acoustic wave, in which a cut angle, at which said substrate is cut from the $Li_2B_4O_7$ single crystal, and the propagation direction of said surface acoustic wave are so set that, when an Eulerian angle representation is (90°±$\lambda$, 90°±$\mu$, 90°±$\theta$), a range is 40°<$\lambda$<50°, $\mu = 0°$ to 5°, and $\theta = 0°$ to 10°.

2. A surface acoustic wave device according to claim 1, in which said range is $\lambda = 42±1°$, $\mu = 0±1°$ and $\theta = 0±1°$.

3. A surface acoustic wave device according to claim 1, in which said range is $\lambda = 45±1°$, $\mu = 0±1°$ and $\theta = 0±1°$.

4. A surface acoustic wave device according to claim 1, which is a surface acoustic wave filter in which a plurality of electroacoustic interdigital electrodes are formed as thin films made principally of aluminum, on the surface of the $Li_2B_4O_7$ single crystal substrate.

5. A surface acoustic wave device according to claim 1, which is a surface acoustic wave resonator in which electroacoustic interdigital electrodes and grating reflectors are formed as thin films made principally of aluminum, on the surface of said $Li_2B_4O_7$ single crystal substrate.

6. A surface acoustic wave device according to claim 5, in which the thickness of said films of said grating reflectors is 0.005 to 0.015 which corresponds to the wavelength of said surface acoustic wave.

7. A surface acoustic wave device according to claim 1, in which $\lambda = 45°±1°$, $\mu = 0°$ to 5° and $\theta = 0°$ to 10°.

8. A surface acoustic wave device according to claim 5, in which the normalized thickness of said films of said grating reflectors is 0.005 to 0.01 which corresponds to the wavelength of said surface acoustic wave.

* * * * *